(12) United States Patent
Sakai et al.

(10) Patent No.: US 11,365,922 B2
(45) Date of Patent: Jun. 21, 2022

(54) TEMPERATURE CONTROL DEVICE AND TEMPERATURE ADJUSTMENT APPARATUS

(71) Applicant: SHINWA CONTROLS CO., LTD, Kawasaki (JP)

(72) Inventors: Seiichiro Sakai, Kawasaki (JP); Katsutoshi Sakai, Kawasaki (JP)

(73) Assignee: Shinwa Controls Co., Ltd, Kawasaki (JP)

( * ) Notice: Subject to any disclaimer, the term of this patent is extended or adjusted under 35 U.S.C. 154(b) by 0 days.

(21) Appl. No.: 15/734,034

(22) PCT Filed: Apr. 27, 2020

(86) PCT No.: PCT/JP2020/017972
§ 371 (c)(1),
(2) Date: Dec. 1, 2020

(87) PCT Pub. No.: WO2020/261749
PCT Pub. Date: Dec. 30, 2020

(65) Prior Publication Data
US 2021/0262715 A1   Aug. 26, 2021

(30) Foreign Application Priority Data

Jun. 26, 2019   (JP) .............................. JP2019-118358

(51) Int. Cl.
*F25B 49/02* (2006.01)
*F25B 41/20* (2021.01)
(Continued)

(52) U.S. Cl.
CPC ............... *F25B 49/02* (2013.01); *F25B 5/02* (2013.01); *F25B 39/00* (2013.01); *F25B 41/20* (2021.01);
(Continued)

(58) Field of Classification Search
CPC .. F25B 49/02; F25B 41/20; F25B 5/02; F25B 39/00; F25B 2600/2515; F25B 2700/21
See application file for complete search history.

(56) References Cited

U.S. PATENT DOCUMENTS 5,222,371 A * 6/1993 Doyama ................. F25B 13/00
62/204
5,259,210 A * 11/1993 Ohya ................. G05B 13/0275
62/212

(Continued)

FOREIGN PATENT DOCUMENTS

JP           5841281 B1     1/2016

OTHER PUBLICATIONS

International Search Report and Written Opinion (Application No. PCT/JP2020/017972) dated Jul. 7, 2020.

*Primary Examiner* — Miguel A Diaz
(74) *Attorney, Agent, or Firm* — Burr & Brown, PLLC

(57) ABSTRACT

A temperature control device for controlling a temperature of a temperature adjustment target part is provided. A communication module of the temperature control device is configured to store target temperature information of each of the temperature adjustment target parts included in a communication frame periodically received via a field network in a predetermined position of a memory, and an arithmetic operation module of the temperature control device receives the target temperature information of each of the temperature adjustment target parts, receives refrigerant temperature information from each of temperature sensors corresponding to each of the temperature adjustment target parts, and calculates each of control parameter for adjusting an opening degree of each corresponding control valve so that each temperature of the temperature adjustment target parts becomes a target temperature indicated by the received (Continued)

target temperature information based on the received target temperature information and the received refrigerant temperature information.

6 Claims, 5 Drawing Sheets

(51) Int. Cl.
    *F25B 39/00*     (2006.01)
    *F25B 5/02*     (2006.01)

(52) U.S. Cl.
    CPC ... *F25B 2600/2515* (2013.01); *F25B 2700/21* (2013.01)

(56) References Cited

U.S. PATENT DOCUMENTS

| | | | | |
|---|---|---|---|---|
| 5,782,103 A * | 7/1998 | Schmidt | ............ | F25B 41/31 |
| | | | | 62/225 |
| 6,854,285 B2 * | 2/2005 | Jessen | ............ | F25B 49/02 |
| | | | | 236/92 B |
| 9,739,514 B2 * | 8/2017 | Seki | ............ | F25B 49/02 |
| 9,874,385 B2 * | 1/2018 | Izadi-Zamanabadi | ............ | |
| | | | | F25B 49/02 |
| 10,415,862 B2 * | 9/2019 | Seki | ............ | H01J 37/32935 |
| 10,418,915 B2 * | 9/2019 | Iwata | ............ | H02M 1/00 |
| 10,451,324 B2 * | 10/2019 | Kawagoe | ............ | F25B 45/00 |
| 10,665,432 B2 * | 5/2020 | Mitsumori | ............ | H01L 21/67248 |
| 11,073,309 B2 * | 7/2021 | Seki | ............ | F25B 25/005 |
| 2003/0132850 A1 * | 7/2003 | Ozawa | ............ | F25D 17/02 |
| | | | | 340/686.1 |
| 2006/0213763 A1 * | 9/2006 | Furuya | ............ | H01J 37/32009 |
| | | | | 204/192.1 |
| 2009/0044752 A1 * | 2/2009 | Furuya | ............ | H01J 37/32091 |
| | | | | 118/723 E |
| 2015/0128628 A1 * | 5/2015 | Kawagoe | ............ | F25B 41/26 |
| | | | | 62/160 |
| 2015/0330688 A1 * | 11/2015 | Goel | ............ | F25B 49/02 |
| | | | | 62/115 |
| 2016/0084553 A1 * | 3/2016 | Seki | ............ | F25B 49/02 |
| | | | | 62/204 |
| 2016/0201952 A1 * | 7/2016 | Jeong | ............ | F25B 13/00 |
| | | | | 62/115 |
| 2016/0245536 A1 * | 8/2016 | Iwasaki | ............ | F24F 11/62 |
| 2017/0082334 A1 * | 3/2017 | Kawagoe | ............ | F25B 13/00 |
| 2017/0092471 A1 * | 3/2017 | Wakai | ............ | H01L 21/67248 |
| 2018/0038620 A1 * | 2/2018 | Seki | ............ | C23C 16/463 |
| 2018/0041137 A1 * | 2/2018 | Iwata | ............ | F25B 1/00 |
| 2019/0242604 A1 * | 8/2019 | Wan | ............ | F25B 13/00 |
| 2020/0348063 A1 * | 11/2020 | Jankowsky | ............ | H04Q 9/00 |

* cited by examiner

FIG.5

| ADDRESS | INFORMATION |
|---|---|
| 00 | DATA 1 (CH1 TARGET TEMPERATURE) |
| 01 | DATA 2 (CH2 TARGET TEMPERATURE) |
| 02 | DATA 3 (CH3 TARGET TEMPERATURE) |
| 03 | DATA 4 (CH1 CURRENT TEMPERATURE) |
| 04 | DATA 5 (CH2 CURRENT TEMPERATURE) |
| 05 | DATA 6 (CH3 CURRENT TEMPERATURE) |
| ... | |

FIG.6

MODULE 00

| ADDRESS | INFORMATION |
|---|---|
| 00 | DATA 1 (CH1 TARGET TEMPERATURE) |
| 01 | DATA 2 (CH1 CURRENT TEMPERATURE) |
| ... | |

MODULE 01

| ADDRESS | INFORMATION |
|---|---|
| 00 | DATA 1 (CH2 TARGET TEMPERATURE) |
| 01 | DATA 2 (CH2 CURRENT TEMPERATURE) |
| ... | |

MODULE 02

| ADDRESS | INFORMATION |
|---|---|
| 00 | DATA 1 (CH3 TARGET TEMPERATURE) |
| 01 | DATA 2 (CH3 CURRENT TEMPERATURE) |
| ... | |

TEMPERATURE CONTROL DEVICE AND TEMPERATURE ADJUSTMENT APPARATUS

BACKGROUND OF THE INVENTION

1. Field of the Invention

The present invention relates to a temperature control device and a temperature adjustment apparatus, and particularly relates to a temperature control device for controlling a temperature of a temperature adjustment target part in a temperature adjustment target device in a temperature adjustment apparatus including a refrigerant circuit, and the temperature adjustment apparatus including the temperature control device.

2. Description of Related Art

Conventionally, a general chiller apparatus has included a refrigerant circuit (refrigerant passage), and the refrigerant circuit has had a circuit configuration in which a refrigerant is circulated inside a pipe by a refrigerant passage and a brine passage, and a workpiece (temperature adjustment target part) that is a load of a temperature adjustment target is interposed in and connected to a local area of the brine passage.

In the refrigerant passage, an electric compressor compresses refrigerant gas and feeds the refrigerant gas to a condenser at a discharge side as high-pressure gas, and the condenser condenses the high-pressure gas, decompresses the gas through an expansion valve of a decompression mechanism, and thereafter feeds the decompressed gas to an evaporator. Subsequently, the evaporator vaporizes the decompressed low-pressure refrigerant in a gas-liquid mixed state to cause the refrigerant to be sucked into a suction side of the compressor. The refrigerant circuit is a primary temperature adjustment circuit of the circuit configuration that repeats compression and decompression like this. The brine passage is a secondary temperature adjustment circuit of a circuit configuration that shares the evaporator of the refrigerant passage to collect and store a low-pressure refrigerant liquid in a liquid state in a refrigerant tank, and returns the refrigerant liquid properly heated by a heating device (heater) attached to the refrigerant tank to the evaporator with the workpiece interposed.

A temperature control device included by the chiller apparatus controls the number of revolutions of the compressor included by the refrigerant passage, a heating temperature of the heating device included by the brine passage, a refrigerant flow rate by a pump connected to the refrigerant tank and the like in response to a temperature difference between temperature setting and a set temperature by a user, and a workpiece temperature. The temperature setting is selected from a predetermined range of, for example, −20 to 60° C. The refrigerant passage and the brine passage are provided with temperature sensors, respectively, and the workpiece temperature is detected from a temperature sensor provided at a spot at a workpiece side from the pump in the brine passage.

For example, Patent Literature 1 discloses a chiller apparatus for plasma treatment apparatus to which a plasma treatment apparatus that performs plasma treatment for etching a sample to be a target on a workpiece, and also discloses a refrigerant circuit of the chiller apparatus.

CITATION LIST

Patent Literature

Patent Literature 1: Japanese Patent No. 5841281

SUMMARY OF THE INVENTION

Technical Problem

The temperature control device can control the temperature of the refrigerant passage by adjusting the opening degree of the expansion valve capable of adjusting the refrigerant flow rate in the refrigerant passage. The temperature control device includes a main CPU board, and the main CPU board calculates a control parameter for adjusting the opening degree of the expansion valve. Conventionally, when calculating the control parameter, the main CPU board has acquired target temperature information of a temperature adjustment target part by transmitting a request to a temperature adjustment target device including the temperature adjustment target part at each time, and has stored the target temperature information in a memory. Subsequently, the main CPU board performs arithmetic operation of the control parameter by using current temperature information and the target temperature information that are stored in the memory and transmits the control parameter to a pulse converter, and the pulse converter converts the received control parameter of an analog signal into a pulse for driving the expansion valve and outputs the pulse for driving the expansion vale. However, there is the problem that when the number of temperature adjustment target parts increases, it is difficult to calculate the control parameters by the main CPU board in real time, and there is the problem that temperature control of a plurality of temperature adjustment target parts is difficult.

The present invention is made to solve the problems as above, and has a main object to provide a temperature control device that can more properly control a temperature even when a number of temperature adjustment target parts increases.

Solution to Problem

In order to attain the above described object, a temperature control device as one aspect of the present invention is a temperature control device for controlling a temperature of a temperature adjustment target part in a temperature adjustment target device, in a temperature adjustment apparatus including a refrigerant circuit, wherein the temperature adjustment apparatus includes the refrigerant circuit for each one or each plurality of temperature adjustment target parts, and each of the refrigerant circuits includes a first refrigerant circuit including a circuit in which a compressor, a condenser, an expansion valve and an evaporator circulate a first refrigerant in this order, the first refrigerant circuit including a control valve that is attached to an inside of the first refrigerant circuit and capable of adjusting a flow rate of the first refrigerant, and a second refrigerant circuit sharing the evaporator with the first refrigerant circuit, the second refrigerant circuit including a circuit that circulates a second refrigerant so that the second refrigerant can exchange heat with the temperature adjustment target part, the second refrigerant circuit including temperature sensors that are attached to be able to detect a temperature of the second refrigerant, the temperature control device including a main control device, a communication module including a memory and connected to the temperature adjustment target device via a field network, an arithmetic operation module connected to the communication module via the main control device, and connected to respective temperature sensors attached to respective predetermined positions of the second refrigerant circuit, and a signal output module connected to the arithmetic operation module, wherein the communication module is configured to store target temperature information of each of the temperature adjustment target parts included in a communication frame periodically received via the field network in a predetermined position of the memory that is determined in advance for each of the temperature adjustment target parts, the main control device is configured to transmit the target temperature information stored in the memory of the communication module to the arithmetic operation module, the arithmetic operation module is configured to receive the target temperature information of each of the temperature adjustment target parts, receive refrigerant temperature information indicating a current temperature of the second refrigerant from each of the temperature sensors corresponding to each of the temperature adjustment target parts, calculate each of control parameters for adjusting an opening degree of each of corresponding control valves so that each temperature of the temperature adjustment target parts becomes a target temperature indicated by the received target temperature information based on the received target temperature information and the received refrigerant temperature information, and transmit each of the calculated control parameters to the signal output module, and the signal output module is configured to transmit a signal for adjusting the opening degree of each of the control valves to each of the control valves based on each of the received control parameters.

Preferably, in the present invention, the arithmetic operation module calculates each of control parameters for adjusting the opening degree of each of the corresponding control valves by executing a PID arithmetic operation to achieve the target temperature based on the received target temperature information and the received refrigerant temperature information.

Preferably, in the present invention, the arithmetic operation module includes a memory, stores the received target temperature information and the received refrigerant temperature information in a predetermined position of the memory that is determined in advance for each of the temperature adjustment target parts, calculates each of control parameters by using the stored target temperature information and the stored refrigerant temperature information, and stores each of the calculated control parameters in a predetermined position of the memory that is determined in advance for each of the temperature adjustment target parts.

Preferably, in the present invention, the field network is EtherCAT.

Preferably, in the present invention, one of the temperature adjustment target devices is a master, and the communication module is a slave.

Further, in order to attain the above described object, a temperature adjustment apparatus as one aspect of the present invention is a temperature adjustment apparatus including a refrigerant circuit and a temperature control device for controlling a temperature of a temperature adjustment target part in a temperature adjustment target device, the temperature adjustment apparatus including the refrigerant circuit for each one or each plurality of temperature adjustment target parts, wherein each of the refrigerant circuits includes a first refrigerant circuit including a circuit in which a compressor, a condenser, an expansion valve and an evaporator circulate a first refrigerant in this order, the first refrigerant circuit including a control valve that is attached to an inside of the first refrigerant circuit and capable of adjusting a flow rate of the first refrigerant, and a second refrigerant circuit sharing the evaporator with the first refrigerant circuit, the second refrigerant circuit including a circuit that circulates a second refrigerant so that the second refrigerant can exchange heat with the temperature adjustment target part, the second refrigerant circuit including temperature sensors that are attached to be able to detect a temperature of the second refrigerant, and the temperature control device includes a main control device, a communication module including a memory and connected to the temperature adjustment target device via a field network, an arithmetic operation module connected to the communication module via the main control device, and connected to respective temperature sensors attached to respective predetermined positions of the second refrigerant circuit, and a signal output module connected to the arithmetic operation module, wherein the communication module is configured to store target temperature information of each of the temperature adjustment target parts included in a communication frame periodically received via the field network in a predetermined position of the memory that is determined in advance for each of the temperature adjustment target parts, the main control device is configured to transmit the target temperature information stored in the memory of the communication module to the arithmetic operation module, the arithmetic operation module is configured to receive the target temperature information of each of the temperature adjustment target parts, receive refrigerant temperature information indicating a current temperature of the second refrigerant from each of the temperature sensors corresponding to each of the temperature adjustment target parts, calculate each of control parameters for adjusting an opening degree of each of corresponding control valves so that each temperature of the temperature adjustment target parts becomes a target temperature indicated by the received target temperature information based on the received target temperature information and the received refrigerant temperature information, and transmit each of the calculated control parameters to the signal output module, and the signal output module is configured to transmit a signal for adjusting the opening degree of each of the control valves to each of the control valves based on each of the received control parameters.

Advantageous Effect of Invention

According to the present invention, even when the number of temperature adjustment target parts increases, the temperature is more properly controlled.

BRIEF DESCRIPTION OF DRAWINGS

FIG. 5 is an illustration of one kind of information that is stored in a memory of a communication module of one embodiment of the present invention.

FIG. 6 is an illustration of one kind of information that is stored in a memory of an arithmetic operation module of one embodiment of the present invention.

DETAILED DESCRIPTION OF THE INVENTION

Hereinafter, a temperature adjustment apparatus 1 of an embodiment of the present invention will be described with reference to the drawings. The same reference signs in the respective drawings represent the same or corresponding parts unless otherwise mentioned. More detailed explanation than necessary may be omitted, for convenience of explanation. For example, detailed explanation of the matters that are already well known and redundant explanation of substantially the same components may be omitted. Note that in the present description, receiving/transmitting information can include simply receiving/transferring the information.

Figure 1:
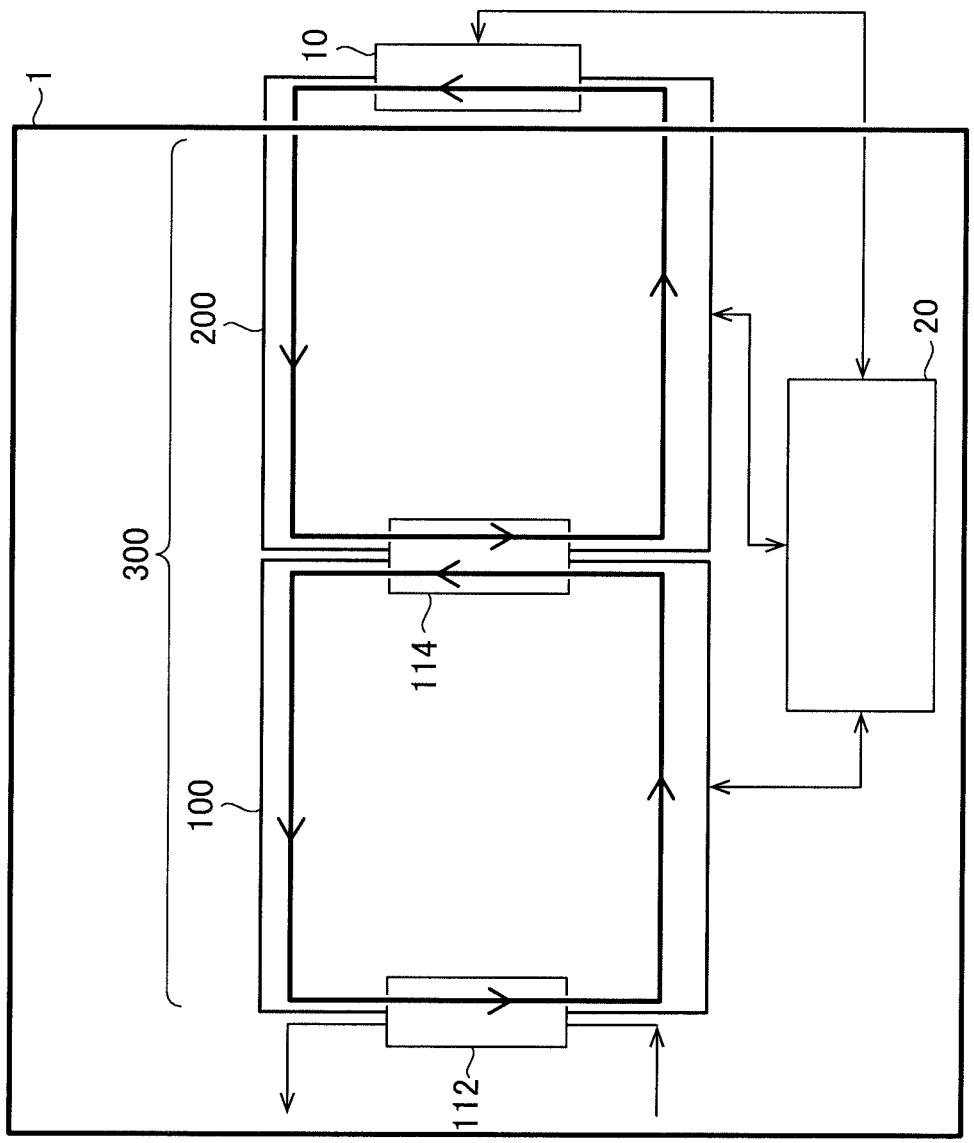
FIG. 1 is an outline configuration diagram of a temperature adjustment apparatus of one embodiment of the present invention.
Figure 2:
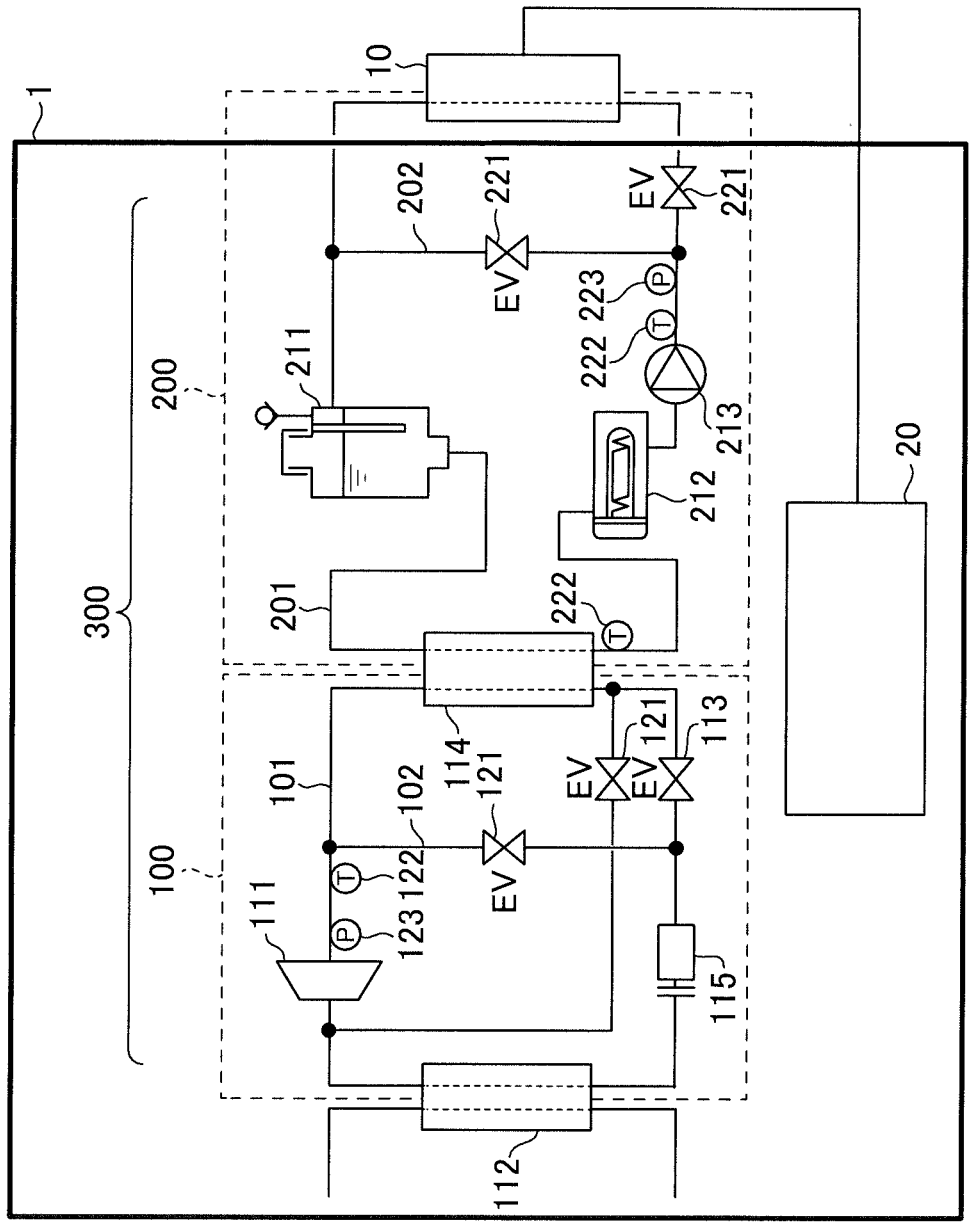
FIG. 2 is an outline configuration diagram of the temperature adjustment apparatus of one embodiment of the present invention.

FIG. 1 and FIG. 2 are outline configuration diagrams of a temperature adjustment apparatus 1 of one embodiment of the present invention, and FIG. 2 is a diagram illustrating a more detailed outline configuration diagram. The temperature adjustment apparatus 1 includes a refrigerant circuit 300 including a first refrigerant circuit 100 and a second refrigerant circuit 200, and a temperature control device 20 for controlling a temperature of each of temperature adjustment target parts 10 of a temperature adjustment target device 2. FIG. 1 shows main directions in which a refrigerant flows in the first refrigerant circuit 100 and the second refrigerant circuit 200. The temperature adjustment apparatus 1 is an apparatus for adjusting respective temperatures of a plurality of temperature adjustment target parts 10, but FIG. 1 illustrates a configuration of the refrigerant circuit 300 to a single temperature adjustment target part 10. The temperature adjustment apparatus 1 includes the refrigerant circuit 300 for each of the temperature adjustment target parts 10. The refrigerant circuit 300 is configured by, for example, a known cooling pipe. A known refrigerant such as a fluorine-based refrigerant can be used as a first refrigerant used in the first refrigerant circuit 100 and a second refrigerant used in the second refrigerant circuit 200. In one example, the first refrigerant circuit 100 is a refrigerant passage, and the second refrigerant circuit 200 is a brine passage. The temperature control device 20 is connected to the temperature adjustment target device 2 including the temperature adjustment target parts 10, and is connected to various sensors such as temperature sensors and controllable components such as control valves that are included by the first refrigerant circuit 100 and the second refrigerant circuit 200. The temperature control device 20 may be connected to the temperature adjustment target device 2 to be indirectly connected to the temperature adjustment target parts 10, or may be directly connected to the temperature adjustment target parts 10 in the temperature adjustment target device 2. In one preferable example, the temperature control device 20 receives target temperature information of each of the temperature adjustment target parts 10 from the temperature adjustment target device 2, and transmits current temperature information acquired from the temperature sensor in the second refrigerant circuit 200 to the temperature adjustment target device 2.

The first refrigerant circuit 100 includes a first main refrigerant circuit 101 in which a compressor 111, a condenser 112, an expansion valve 113 and an evaporator 114 circulate the first refrigerant in this order. The first main refrigerant circuit 101 includes a dryer filter 115 that is interposed and connected between the condenser 112 and the expansion valve 113, and removes foreign matter. The first refrigerant circuit 100 includes a bypass circuit 102 that branches from the first main refrigerant circuit 101, between the evaporator 114 and the compressor 111, and is connected to the first main refrigerant circuit 101 between the dryer filter 115 and the expansion valve 113. The first refrigerant circuit 100 includes a bypass circuit 102 that branches from the first main refrigerant circuit 101, between the compressor 111 and the condenser 112, and is connected to the first main refrigerant circuit 101 between the expansion valve 113 and the evaporator 114.

In the first main refrigerant circuit 101, the compressor 111 compresses gas of the first refrigerant and feeds the gas of the first refrigerant to the condenser 112 at a discharge side as high-pressure gas. The condenser 112 condenses the high-pressure gas to pass the gas to the expansion valve 113 of a decompression mechanism to decompress the gas to feed the gas to the evaporator 114 thereafter, and the evaporator 114 vaporizes the decompressed low-pressure gas to cause the low-pressure gas to be sucked into an intake side of the compressor 111. The first main refrigerant circuit 101 is a primary temperature adjustment circuit of a circuit configuration that repeats compression and decompression in this way.

The first refrigerant circuit 100 includes a plurality of control valves 121 that are attached to an inside of the first refrigerant circuit 100 and capable of adjusting a flow rate of the first refrigerant. The control valve 121 is interposed and connected between the expansion valve 113 and the evaporator 114 of the first main refrigerant circuit 101. The control valves 121 are interposed in and connected to the respective bypass circuits 102. The control valve 121 is an electronic control valve driven by a stepping motor, and the temperature control device 20 can control flow rates of the first refrigerant passing through the control valves 121 by sending signals to adjust opening degrees of the control valves 121 to the respective control valves 121. The temperature control device 20 can also control the expansion valve 113 similarly. Note that an electronic expansion valve can also be adopted as the control valve 121.

The first refrigerant circuit 100 includes a temperature sensor 122 provided to be able to detect a temperature of the first refrigerant in the first main refrigerant circuit 101, at an evaporator side of the compressor 111. The first refrigerant circuit 100 includes a pressure sensor 123 provided to be able to detect a pressure of the first refrigerant in the first main refrigerant circuit 101, at a first refrigerant intake side of the compressor 111.

The second refrigerant circuit 200 includes a second main refrigerant circuit 201 that shares the evaporator 114 with the first refrigerant circuit 100. The second main refrigerant circuit 201 circulates a second refrigerant so as to be able to exchange heat with the first main refrigerant circuit 101 in the evaporator 114. Further, the second main refrigerant circuit 201 circulates the second refrigerant to be able to exchange heat with the temperature adjustment target part 10. The second main refrigerant circuit 201 and the temperature adjustment target part 10 are configured so that the second main refrigerant circuit 201 and the temperature adjustment target part 10 contact each other to be able to exchange heat, or so that the second main refrigerant circuit 201 passes through an inside of the temperature adjustment target part 10 to be able to exchange heat.

The second main refrigerant circuit 201 includes a refrigerant tank 211 that collects and stores a refrigerant liquid that is the second refrigerant, a heating device 212, and a pump 213 that sucks the refrigerant liquid from the heating device 212. The heating device 212 properly heats the refrigerant liquid as necessary. The second main refrigerant circuit 201 is a secondary temperature adjustment circuit of a circuit configuration that adjusts a temperature of the second refrigerant by the evaporator 114 and the heating device 212, and circulates the second refrigerant so as to exchange heat with the temperature adjustment target part 10. In the second main refrigerant circuit 201, the heating device 212 is connected to a refrigerant liquid outflow side of the evaporator 114, and the pump 213 is connected so as to be able to suck the refrigerant liquid from the heating device 212. The refrigerant tank 211 is connected so as to collect the refrigerant liquid that exchanges heat with the temperature adjustment target part 10, and is connected to the evaporator 114 so that the refrigerant liquid that is caused to flow out exchanges heat in the evaporator 114.

The second refrigerant circuit 200 includes a bypass circuit 202 that branches from the second main refrigerant circuit 201, between the temperature adjustment target part 10 and the refrigerant tank 211, and is connected to the second main refrigerant circuit 201 between the pump 213 and the temperature adjustment target part 10.

The second refrigerant circuit 200 includes control valves 221 that are attached to an inside of the second refrigerant circuit 200 and capable of adjusting flow rates of the second refrigerant. The control valve 221 is interposed and connected between the pump 213 of the second main refrigerant circuit 201 and the temperature adjustment target part 10. The control valve 221 is interposed in and connected to the bypass circuit 202.

The second refrigerant circuit 200 includes a temperature sensor 222 that is provided to be able to detect a temperature of the second refrigerant in the second main refrigerant circuit 201, at a refrigerant liquid outflow side of the pump 213. The second refrigerant circuit 200 includes a temperature sensor 222 that is provided to be able to detect the temperature of the second refrigerant in the second main refrigerant circuit 201, at a refrigerant liquid outflow side of the evaporator 114. In this way, the second refrigerant circuit 200 includes the temperature sensors 222 that are attached to be able to detect the temperature of the second refrigerant. Further, the second refrigerant circuit 200 includes a pressure sensor 223 that is provided to be able to detect a pressure of the second refrigerant in the second main refrigerant circuit 201, at the refrigerant liquid outflow side of the pump 213.

FIG. 1 is an illustration of the refrigerant circuit 300 to the single temperature adjustment target part 10. The temperature adjustment apparatus 1 includes a plurality of refrigerant circuits 300, and each of the refrigerant circuits 300 corresponds to each of the temperature adjustment target parts 10. Accordingly, the refrigerant circuits 300 included by the temperature adjustment apparatus 1 may include different circuits, or may be the same circuits.

In one example of the refrigerant circuit 300, the first refrigerant circuit 100 includes any one or a plurality of bypass circuits 102 different from the bypass circuits 102 illustrated in FIG. 1, according to a temperature insulation control method of the temperature adjustment target part 10. In this case, the control valve 121 is preferably interposed in and connected to each of the bypass circuits 102. Further, in one example, in the first refrigerant circuit 100, one or a plurality of temperature sensors 122 is or are attached to a predetermined position or predetermined positions according to the temperature insulation control method of the temperature adjustment target part 10. Further, in one example, in the first refrigerant circuit 100, one or a plurality of pressure sensors 123 is or are attached to a predetermined position or the predetermined positions according to the temperature insulation control method of the temperature adjustment target part 10.

In one example of the refrigerant circuit 300, the refrigerant circuit 300 includes a plurality of first refrigerant circuits 100 according to a heat insulation temperature of the temperature adjustment target part 10. Circuit configurations included by the plurality of first refrigerant circuits 100 may differ respectively. In this case, one first refrigerant circuit 100 shares the evaporator 114 with the adjacent first refrigerant circuit 100, and includes the first main refrigerant circuit 101 that circulates the first refrigerant so as to be able to exchange heat with the adjacent first refrigerant circuit 100. Further, in this case, the one first refrigerant circuit 100 shares the evaporator 114 with the second refrigerant circuit 200, and includes the first main refrigerant circuit 101 that circulates the first refrigerant so as to be able to exchange heat with the second refrigerant circuit 200.

In one example of the refrigerant circuit 300, the second refrigerant circuit 200 includes arbitrary one or a plurality of bypass circuits 102 different from the bypass circuit 202 illustrated in FIG. 1, according to the temperature insulation control method of the temperature adjustment target part 10. In this case, the control valve 221 is preferably interposed in and connected to each of the bypass circuits 202. Further, in one example, the second refrigerant circuit 200 does not include the heating device 212 and the pump 213. Further in one example, in the second refrigerant circuit 200, one or a plurality of temperature sensors 222 are attached at predetermined positions, according to the temperature insulation control method of the temperature adjustment target part 10. Further, in one example, in the second refrigerant circuit 200, one or a plurality of pressure sensor 223 are attached at predetermined positions, according to the temperature insulation control method of the temperature adjustment target part 10. Further, in one example, the refrigerant tank 211, the heating device 212, and the pump 213 are attached at positions corresponding to the temperature insulation control method of the temperature adjustment target part 10, in the second main refrigerant circuit 201.

The temperature adjustment apparatus 1 includes a cooling device (not illustrated). The cooling device is connected to the condenser 112 so as to fold back a pipe, and has a structure that takes in cooling water to cool an inside of the condenser 112 and thereafter returns the cooling water outward. In the cooling device, a control valve is provided at a pipe at an outlet side, for example, on and off of the control valve is controlled in accordance with a result detected by a pressure connected to a discharge side of the condenser 112, and a flow rate of the cooling water flowing in the pipe is controlled. The cooling device described in the above is one illustration, and the cooling function to the condenser 112 by the cooling device may be configured to cool by cooling air by using a cooling fan.

In one preferable example, the temperature adjustment apparatus 1 is a chiller apparatus that is applicable to a semiconductor etching process with a workpiece (temperature adjustment target device 2) as a semiconductor manufacturing apparatus. More specifically, the temperature adjustment apparatus 1 is a chiller apparatus for plasma treatment that is applied to a plasma treatment apparatus that performs plasma treatment for etching a semiconductor wafer of a sample to be a target in a semiconductor etching process. Accordingly, the temperature adjustment apparatus 1 can include a configuration of a conventional chiller apparatus for plasma treatment. In this case, respective parts to be temperature insulation targets of the plasma treatment apparatus are the temperature adjustment target parts 10. For example, one temperature adjustment target part 10 is connected in such a manner that a refrigerant pipe is attached to a lower electrode in the plasma treatment apparatus to connect to the second main refrigerant circuit 201. For example, one temperature adjustment target part 10 is connected in such a manner that a refrigerant pipe is additionally provided at an upper electrode in the plasma treatment apparatus to connect to the second main refrigerant circuit 201.

Target temperatures are set to the respective temperature adjustment target parts 10 of the temperature adjustment target device 2 by a user. For example, the target temperature to be set differs according to the temperature adjustment target parts 10. In one example, a target temperature to be set of the temperature adjustment target part 10 is selected from a range of −80 to +80° C. In one example, there are three temperature adjustment target parts 10, and ranges of target temperatures that are set in the respective temperature adjustment target parts 10 differ.

The temperature control device 20 controls a second refrigerant temperature, in each of the temperature adjustment target parts 10, based on target temperature information of the temperature adjustment target part 10 and current temperature information acquired from the temperature sensor 222 attached to the inside of the second refrigerant circuit 200 that is connected to the temperature adjustment target part 10. For example, the temperature control device 20 controls the second refrigerant temperature by adjusting an opening degree of the control valve 121 in the first refrigerant circuit 100 in response to a temperature difference between the target temperature information and the current temperature information, and controls the temperature of the temperature adjustment target part 10 to a target temperature. The temperature control device 20 can perform control corresponding to the temperature difference by using known PID control. Note that the target temperature information is information indicating the target temperature of the temperature adjustment target part 10, and the current temperature information is information indicating the current temperature of the second refrigerant.

In addition to the above described illustration, or instead of the above described illustration, the temperature control device 20 controls the second refrigerant temperature, and can control the temperature of the temperature adjustment target part 10 to the target temperature by adjusting a number of revolutions of the compressor in the electric compressor 111. In addition to the above described illustration, or instead of the above described illustration, the temperature control device 20 can control the temperature of the temperature adjustment target part 10 to the target temperature by adjusting the opening degree of the control valve 121 in the first refrigerant circuit 100 based on the pressure detected by the pressure sensor 123. The temperature control device 20 can perform control corresponding to a pressure difference by using known PID control.

In the present embodiment, among controls by the temperature control device 20, explanation will be made concerning a control of the opening degree of the control valve 121 included by the first refrigerant circuit 100 based on the target temperature of the temperature adjustment target part 10 acquired from the temperature adjustment target device 2 and the current temperature of the second refrigerant acquired from the temperature sensor included by the second refrigerant circuit 200. However, it is to be understood that the temperature control device 20 can perform a known control such as a control of the number of revolutions of the compressor, or a known control of the control valve 121 and the like based on information acquired from other sensors and the like, as an operation to cause the temperature of the temperature adjustment target part 10 to become the target temperature.

In the present embodiment, the temperature control device 20 calculates control parameters (manipulative variables) for adjusting the opening degrees of the respective control valves 121 to eliminate a deviation between the target value and the current value by PID control.

Figure 3:
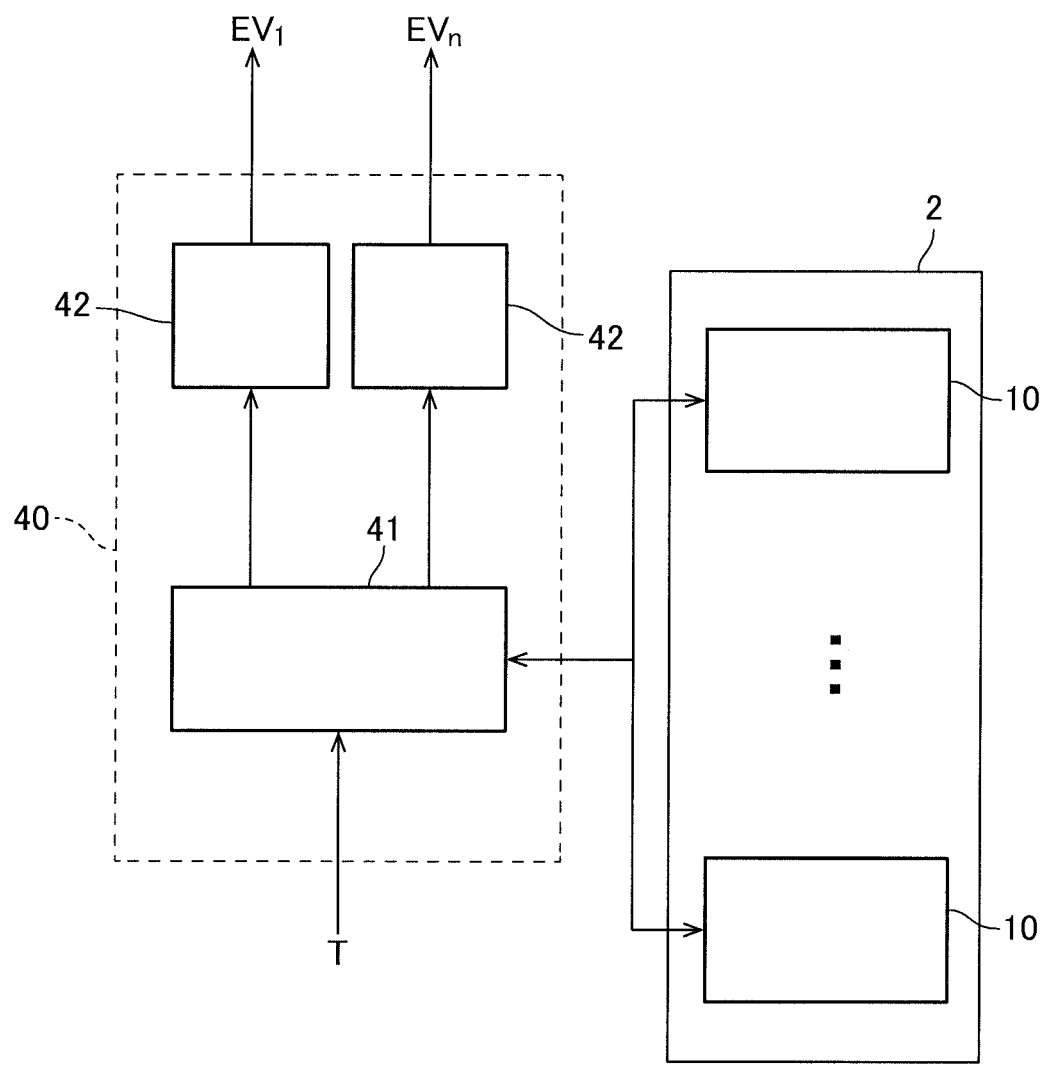
FIG. 3 is an outline configuration diagram of a conventional temperature control device corresponding to a temperature control device of the present embodiment.

FIG. 3 is an outline configuration diagram of a conventional temperature control device 40 corresponding to the temperature control device 20 of the present embodiment. The temperature control device 40 includes a main CPU board 41, and pulse converters 42. The main CPU board 41 acquires current temperature information of a second refrigerant via a temperature sensor 222, and stores the current temperature information in a memory. Every time the main CPU board 41 calculates a control parameter for adjusting an opening degree of a control valve 121, the main CPU board 41 transmits a request to receive target temperature information to a temperature adjustment target device 2 including a temperature adjustment target part 10 corresponding to the control valve. The temperature adjustment target device 2 transmits the target temperature information the request for which is accepted to the temperature control device 20 by using serial communication. The main CPU board 41 acquires the target temperature information of the temperature adjustment target part 10 that is received from the temperature control device 20, and stores the target temperature information in the memory. The main CPU board 41 arithmetically operates the control parameter by using the current temperature information and the target temperature information that are stored in the memory, and transmits the control parameter of an analog signal to the pulse converter 42. The pulse converter 42 converts the control parameter of the analog signal received from the main CPU board 41 into a control valve driving pulse (digital signal), and transmits the control valve driving pulse to the corresponding control valve 121.

As described above, the conventional temperature control device 20 receives the target temperature information by communicating with the temperature adjustment target device 2 every time the temperature control device 20 calculates the control parameter, and performs control to the control valve 121. However, this method has a problem that calculation of the control parameter in real time is difficult when a number of temperature adjustment target parts 10 increases, and it is necessary to calculate the control parameters more efficiently or at a higher speed.

Figure 4:
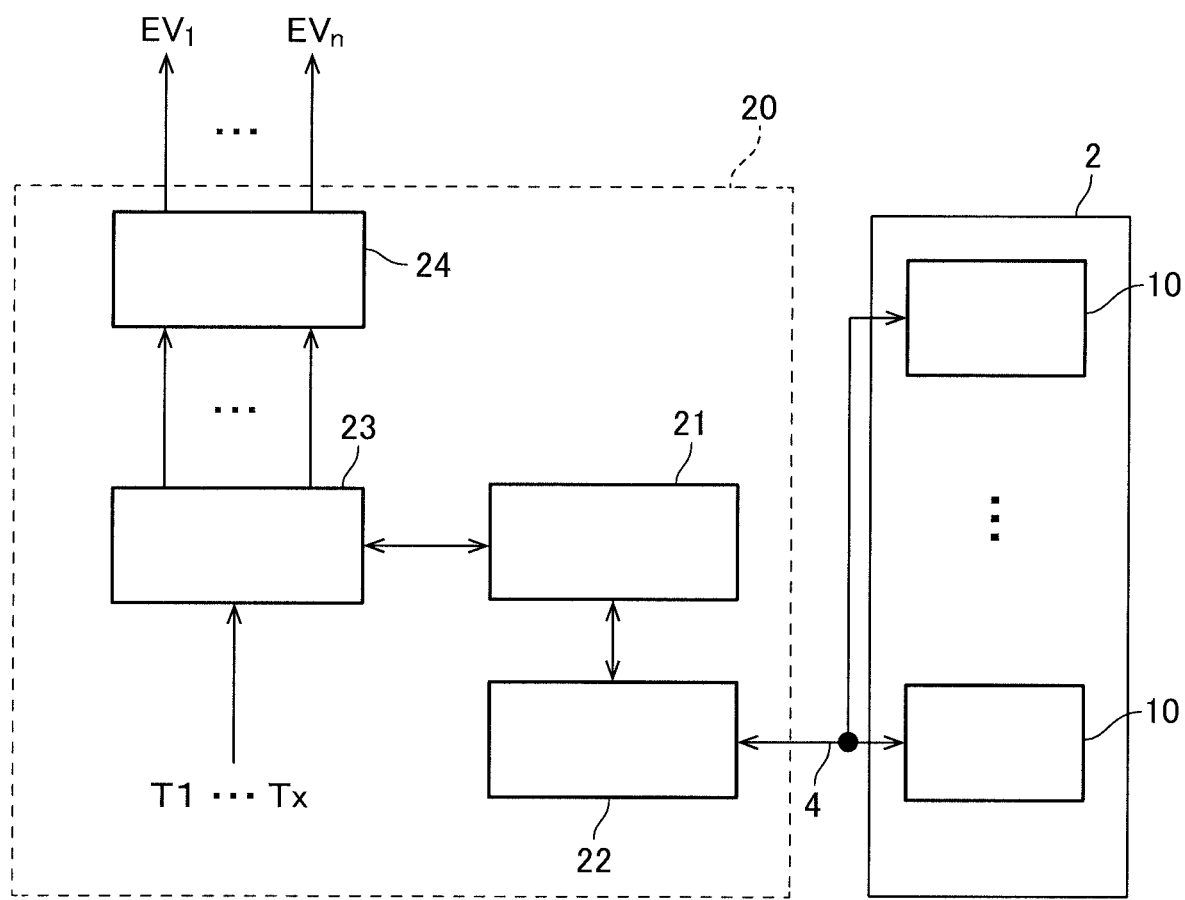
FIG. 4 is a configuration diagram of a temperature control device of one embodiment of the present invention.

FIG. 4 is a configuration diagram of the temperature control device 20 of one embodiment of the present invention. The temperature control device 20 includes a main CPU board 21, a communication module 22, an arithmetic operation module 23, and a signal output module 24.

The main CPU board 21 includes a memory and a processor, and controls the entire temperature control device 20. The main CPU board 21 does not have to be a board as long as it has a function of a main control device that controls the entire temperature control device 20, and is one illustration of the main control device.

The communication module 22 includes a memory, and is connected to the temperature adjustment target device 2 including a plurality of temperature adjustment target parts 10 via a field network 4. Note that FIG. 4 shows one temperature adjustment target device 2, but when the temperature adjustment apparatus 1 controls temperatures of the temperature adjustment target parts 10 included by a plurality of temperature adjustment target devices 2, the communication module 22 is connected to the plurality of temperature adjustment target devices 2 each including one or a plurality of temperature adjustment target parts 10 via the field network 4.

The arithmetic operation module 23 includes a memory, is connected to the communication module 22 via the main CPU board 21, and is connected to the respective temperature sensors 222 that are attached to respective predetermined positions of the second refrigerant circuits 200 included by the refrigerant circuits 300 corresponding to the respective temperature adjustment target parts 10. In one preferable example, the arithmetic operation module 23 is configured by a plurality of submodules, and the respective submodules calculate control parameters corresponding to the respective temperature adjustment target parts 10. In this case, for example, one submodule may calculate a control parameter corresponding to the one temperature adjustment target part 10 assigned to the submodule in advance, or may calculate control parameters corresponding to N (for example, four) temperature adjustment target parts 10 assigned in advance. The arithmetic operation module 23 may be connected to the respective temperature sensors 122 that are attached to the respective predetermined positions of the first main refrigerant circuits 101 included by the refrigerant circuits 300 corresponding to the respective temperature adjustment target parts 10.

The signal output module 24 is connected to the arithmetic operation module 23. The signal output module 24 is connected to respective stepping motors for driving the control valves 121. Note that the stepping motor is a preferable illustration of means for driving the control valve 121, and the means for driving the control valve 121 is not limited to the stepping motor.

Next, operations of the respective parts of the temperature control device 20 will be described.

The communication module 22 stores the target temperature information of each of the temperature adjustment target parts 10 included in a communication frame periodically received via the field network 4 in a predetermined position (address) of a memory determined in advance for each of the temperature adjustment target parts 10. The field network 4 transmits various data exchanged with the temperature adjustment target device 2. In one preferable example, the field network 4 is EtherCAT (EtherCAT) that is one of the industrial open field network standards compatible with Ethernet (registered trademark), and in this case, the communication frame is an Ethernet (registered trademark) frame. In one example, the communication module 22 regularly receives a communication frame at a period of one second or less set in advance such as a period of 0.5 seconds, via the field network 4.

EtherCAT will be briefly described. EtherCAT is a communication method that can realize high speed and real-time performance, and is configured by a master and slaves. An Ethernet (registered trademark) frame is transmitted from the master, passes through all the slaves in order and returns to the master again. The master and the respective slaves can write transmission data to the Ethernet (registered trademark) frame, and can read the received Ethernet (registered trademark) frame.

In one preferable example, one of the temperature adjustment target devices 2 is the master, and the communication modules 22 are slaves. When there is only one temperature adjustment target device 2 that is connected to the field network 4, the temperature adjustment target device 2 is the master. The temperature adjustment target device 2 as a master device regularly transmits the communication frame onto the field network 4. In a position determined in advance of the communication frame, target temperature information of the temperature adjustment target part 10 included by the temperature adjustment target device 2 as the master device is stored in the position determined in advance. The temperature adjustment target device 2 as a slave device writes target temperature information of the temperature adjustment target part 10 included by the temperature adjustment target device 2 to a position determined in advance, to the received communication frame, and thereafter transmits the communication frame onto the field network 4. The communication module 22 as the slave device receives the communication frame via the field network 4, and stores the target temperature information that is stored in the position determined in advance in a predetermined position of the memory of the communication module 22.

The main CPU board 21 transmits the target temperature information stored in the predetermined position of the memory of the communication module 22 to the arithmetic operation module 23. Preferably, the main CPU board 21 regularly reads the target temperature information stored in the predetermined position of the memory of the communication module 22, and transmits the read target temperature information to the arithmetic operation module 23.

The arithmetic operation module 23 receives refrigerant temperature information (current temperature information) indicating a current temperature of the second refrigerant from each of the temperature sensors 222 corresponding to each of the temperature adjustment target parts 10, and stores the refrigerant temperature information in a predetermined position of the memory of the arithmetic operation module 23. When the arithmetic operation module 23 calculates a control parameter, the arithmetic operation module 23 uses the current temperature information. In one preferable example, when calculating the control parameter corresponding to each of the temperature adjustment target parts 10, the arithmetic operation module 23 uses a temperature acquired from the temperature sensor 222 closer to the temperature adjustment target part 10 out of the plurality of temperature sensors 222. In one modified example, when calculating the control parameter corresponding to each of the temperature adjustment target parts 10, the arithmetic operation module 23 uses each temperature acquired from one or a plurality of temperature sensors 222. In one modified example, when calculating the control parameter corresponding to each of the temperature adjustment target parts 10, the arithmetic operation module 23 uses each average of temperatures acquired from the plurality of temperature sensors 222.

The main CPU board 21 transmits the current temperature information stored in the memory of the arithmetic operation module 23 to the communication module 22. Preferably, the main CPU board 21 periodically reads the current temperature information stored in the predetermined position of the memory of the arithmetic operation module 23, and transmits the read current temperature information to the communication module 22.

The communication module 22 stores the current temperature information of each of the temperature adjustment target parts 10 received from the main CPU board 21 in a predetermined position of the memory that is determined in advance for each of the temperature adjustment target parts 10. The communication module 22 writes the current temperature information to the position determined in advance, to the received communication frame, and thereafter, transmits the communication frame to which the current temperature information is written onto the field network 4. Thereby, the temperature adjustment target device 2 becomes capable of receiving the current temperature information, and becomes capable of grasping the current temperature of the second refrigerant in the temperature adjustment target device 2.

FIG. 5 is one illustration of information that is stored in the memory of the communication module 22 of one embodiment of the present invention. In predetermined positions (for example, addresses 00 to 02) of the memory of the communication module 22, the target temperature information (for example, CH1 to CH3 target temperature information) for the respective temperature adjustment target parts 10 acquired from the communication frame received via the field network 4 is stored. Further, in predetermined positions (for example, addresses 03 to 05) of the memory of the communication module 22, the current temperature information (for example, CH1 to CH3 current temperature information) received from the main CPU board 21 is stored. Here, each of channels of CH1 to CH3 corresponds to each of the temperature adjustment target parts 10. Data in which the respective channels corresponding to the respective temperature adjustment target parts 10 are stored are the target temperature information and the current temperature information that are used to calculate the control parameters corresponding to the respective temperature adjustment target parts 10. Note that it is to be understood that the memory of the communication module 22 may store the target temperature information and the current temperature information corresponding to the temperature adjustment target parts 10 of four channels or more.

As described above, the arithmetic operation module 23 receives the target temperature information for each of the temperature adjustment target parts 10, and receives the current temperature information of the second refrigerant from the respective temperature sensors corresponding to the respective temperature adjustment target parts 10.

FIG. 6 is one illustration of information that is stored in the memory of the arithmetic operation module 23 of one embodiment of the present invention. The arithmetic operation module 23 stores the target temperature information and the current temperature information that are received in addresses determined in advance of the memory of the arithmetic operation module 23 for each of the temperature adjustment target parts 10. The memory of the arithmetic operation module 23 is assigned with a module address (for example, modules 00 to 02) for each channel corresponding to each of the temperature adjustment target parts 10. The target temperature information and the current temperature information of each of the channels are stored in predetermined positions (for example, addresses 00 to 01) of the memory that are assigned with each of the module addresses. When the arithmetic operation module 23 is configured by a plurality of submodules, the respective module addresses correspond to the respective submodules. For convenience of explanation, the target temperature information and the current temperature information corresponding to each channel are described as assigned to each of the module addresses, but in one preferable example, a plurality of channels are assigned to one module address. For example, each module address is assigned with four channels.

The arithmetic operation module 23 calculate each control parameter for adjusting an opening degree of each of the corresponding control valves 121 so that each of the temperature adjustment target parts 10 has a target temperature indicated by the received target temperature information based on the target temperature information and the current temperature information that are received. More specifically, the arithmetic operation module 23 calculates the control parameter of the corresponding control valve 121 of each of the temperature adjustment target parts 10, based on the target temperature information and the current temperature information of each of the temperature adjustment target parts 10 that are stored in the memory of the arithmetic operation module 23. The arithmetic operation module 23 stores each of the calculated control parameters in the predetermined position determined in advance for each of the temperature adjustment target parts 10, of the memory of the arithmetic operation module 23, and transmits each of the stored control parameters to the signal output module 24. In one preferable example, the arithmetic operation module 23 calculates the control parameter for adjusting the opening degree of each of the corresponding control valves 121 by executing a PID arithmetic operation to achieve the received target temperature information based on the target temperature information and current temperature information that are received. The control parameter is a manipulative variable for adjusting the opening degree of each of the control valves 121 to eliminate a deviation between the target value and the current value in PID control. The control parameter can be calculated by a known method by using the target temperature information as the target value, and the current temperature information as the current value.

The signal output module 24 is configured to transmit (deliver) signals for adjusting the respective opening degrees of the control valves 121 to the respective control valves 121, based on the respective control parameters received from the arithmetic operation module 23. More specifically, the signal output module 24 converts the control parameters (manipulative variables) of digital signals received from the arithmetic operation module 23 into pulses for adjusting the respective opening degrees of the control valves 121, and transmits the pulses to the respective stepping motors of the respective control valves 121. In one example, the arithmetic operation module 23 calculates the control parameter for each of the module addresses, and the signal output module 24 discriminates an addresses of a signal to be transmitted to the control valve 121 by the module address. In one preferable example, when a plurality of channels are assigned to one module address (submodule), the arithmetic operation module 23 calculates a control parameter for each module address and a channel in the submodule, and the signal output module 24 discriminates an address of a signal to be transmitted to the control valve 121 by the module address and the channel.

Next, effects of the temperature adjustment apparatus 1 and the temperature control device 20 according to the embodiment of the present invention will be described. In the present embodiment, the temperature control device 20 includes the communication module 22 having the memory, and the temperature adjustment target device 2 and the communication module 22 are configured to be communicable via the field network 4. By adopting the configuration like this, it becomes possible to periodically store the target temperature information of each of the temperature adjustment target parts 10 in the predetermined position of the memory of the communication module 22. Further, in the present embodiment, the temperature control device 20 includes the arithmetic operation module 23 for calculating the control parameters. The arithmetic operation module 23 is configured to acquire the current temperature information of the second refrigerant via the temperature sensor 222, and to be able to periodically acquire the target temperature information via the main CPU board 21. By adopting the configuration like this, the arithmetic operation module 23 becomes capable of periodically acquiring the current temperature information and the target temperature information, and the arithmetic operation module 23 becomes capable of calculating the control parameters at a higher speed.

Even if the number of temperature adjustment target parts 10 increases, the target temperature information of each of the temperature adjustment target parts 10 can be stored in the communication frame, and therefore, the communication module 22 becomes capable of periodically acquiring the target temperature information via the field network 4. The arithmetic operation module 23 can acquire the current temperature information of the second refrigerant via the temperature sensor 222, and can periodically acquire the target temperature information from the communication module 22, and therefore becomes capable of calculating the control parameters more efficiently at a higher speed as compared with the conventional temperature control device 40. Accordingly, even when the number of temperature adjustment target parts increases, the temperature control device 20 can control the temperature more properly as compared with the conventional temperature control device 40.

Further, in the present embodiment, by forming the signal output module 24 to be the module integrated with the arithmetic operation module 23, it is possible to perform communication between the modules by using digital signals, and the configuration can be made simpler. Further, in the present embodiment, by modularizing the respective functions of the temperature control device 20, it is possible to make the entire temperature control device 20 compacter.

Further, by adopting the configuration as described above, when the temperature adjustment apparatus 1 is applied to the temperature adjustment target device 2, the temperature adjustment apparatus 1 can acquire the target temperature information of each of the temperature adjustment target parts 10 via the communication frame even if the detailed configuration of the temperature adjustment target device 2 is unknown. Thereby, it is possible to apply the temperature adjustment apparatus 1 to the temperature adjustment target device 2 relatively easily. In a specially preferable example, the field network 4 is EtherCAT, one of the temperature adjustment target devices 2 is a master, and the communication modules 22 are slaves. By adopting the configuration like this, it becomes possible to apply the temperature adjustment apparatus 1 relatively easily to an external device (temperature adjustment target device 2) that is a master device, if the temperature adjustment apparatus 1 that is a slave device is added to the field network 4.

The embodiment of the present invention can be the temperature adjustment apparatus 1 described above, can be the temperature control device 20, or can be a temperature adjustment system including the temperature adjustment apparatus 1 and the temperature adjustment target device 2. Further, another embodiment can be a method that realizes the functions and information processing of the embodiment of the present invention described above. Note that in the embodiment of the present invention described above, the temperature adjustment apparatus 1 includes each of the refrigerant circuits 300 for each one of the temperature adjustment target parts 10, but the temperature adjustment apparatus 1 may include each one of the refrigerant circuits 300 for each one or plurality of temperature adjustment target parts 10.

Hereinafter, modified examples of the embodiment of the present invention will be described. The modified examples described hereinafter can be applied to the arbitrary embodiment, examples or modified examples of the present invention by being properly combined, as long as there is no contradiction.

In one modified example, a communication frame includes first temperature change flag information indicating whether or not a temperature change in a target temperature indicated by the target temperature information in a predetermined time period is a predetermined value or more. For example, the temperature adjustment target device 2 determines whether or not the temperature change in the target temperature is the predetermined value or more in the predetermined time period, and writes "0" when the temperature change is less than the predetermined value, and writes "1" when the temperature change is the predetermined value or more, as the first temperature change flag information. When the first temperature change flag information indicates a temperature change of less than the predetermined value, the temperature control device 20 performs a normal temperature control operation. When the first temperature change flag information indicates a temperature change of the predetermined value or more, the temperature control device 20 operates to preferentially perform control of controllable components such as the control valves 121 in the refrigerant circuit 300 corresponding to the temperature adjustment target part 10 showing the temperature change. In this case, the temperature adjustment target device 2 may operate to make a period of transmitting the communication frame onto the field network 4 shorter than usual. By adopting the configuration like this, when the user greatly changes the target temperature setting to some of the temperature adjustment target parts 10, it becomes possible to perform control with higher responsiveness, and it becomes possible to control the temperature more properly.

In one modified example, the communication frame includes second temperature change flag information indicating whether or not a temperature change in a current temperature indicated by current temperature information in a predetermined time period is the predetermined value or more. The temperature control device 20 determines whether or not the temperature change in the current temperature is the predetermined value or more in the predetermined time period. When the temperature control device 20 determines that the temperature change in the current temperature is less than the predetermined value in the predetermined time period, the temperature control device 20 performs a normal temperature control operation. When the temperature control device 20 determines that the temperature change in the current temperature is the predetermined value or more in the predetermined time period, the temperature control device 20 writes flag information indicating presence of the temperature change of the predetermined value or more (for example, changes "0" indicating absence of the temperature change to "1" indicating the presence of the temperature change) to a position to store the second temperature change flag information of the communication frame that is received, and transmits the written communication frame onto the field network 4. In this case, at least one of the temperature control device 20 and the temperature adjustment target device 2 that receives the second temperature change flag information transmits notification for notifying a computer or the like used by the user of a temperature anomaly. By adopting the configuration like this, it becomes possible for the user to monitor an abrupt temperature change of the refrigerant in the refrigerant circuit 300 at short time intervals of transmission and reception periods of the communication frame, and when an abnormality relating to the abrupt temperature change occurs in the temperature adjustment apparatus 1 or the temperature adjustment target device 2, it becomes possible to detect the abnormality faster.

The respective examples described thus far are illustrations for explaining the present invention, and the present invention is not limited to the examples. The respective examples can be applied to an arbitrary embodiment of the present invention by being properly combined, as long as there is no contradiction. In other words, the present invention can be carried out in various modes as long as it does not depart from the gist of the present invention.

REFERENCE SIGNS LIST

1 Temperature adjustment apparatus
2 Temperature adjustment target device
4 Field network
10 Temperature adjustment target part
20 Temperature control device
21 Main CPU board
22 Communication module
23 Arithmetic operation module
24 Signal output module
40 Temperature control device
41 Main CPU board
42 Pulse converter
100 First refrigerant circuit
101 First main refrigerant circuit
102 Bypass circuit
111 Compressor
112 Condenser
113 Expansion valve
114 Evaporator
115 Dryer filter
121 Control valve
122 Temperature sensor
123 Pressure sensor
200 Second refrigerant circuit
201 Second main refrigerant circuit
202 Bypass circuit
211 Refrigerant tank
212 Heating device
213 Pump
221 Control valve
222 Temperature sensor
223 Pressure sensor
300 Refrigerant circuit

The invention claimed is:

1. A temperature control device for controlling a temperature of a plurality of temperature adjustment target parts in a temperature adjustment target device, in a temperature adjustment apparatus including at least one refrigerant circuit,
wherein the temperature adjustment apparatus includes one of the refrigerant circuits for at least one of the plurality of temperature adjustment target parts, and each of the at least one refrigerant circuit includes
a first refrigerant circuit including a circuit in which a compressor, a condenser, an expansion valve and an evaporator circulate a first refrigerant in this order, the first refrigerant circuit including a control valve that is attached to an inside of the first refrigerant circuit and capable of adjusting a flow rate of the first refrigerant, and
a second refrigerant circuit sharing the evaporator with the first refrigerant circuit, the second refrigerant circuit including a circuit that circulates a second refrigerant so that the second refrigerant can exchange heat with the at least one of the plurality of temperature adjustment target parts, the second refrigerant circuit including temperature sensors attached to respective predetermined positions of the second refrigerant circuit, the temperature sensors configured to detect a temperature of the second refrigerant,
the temperature control device comprising:
a main control device;
a communication module including a memory and connected to the temperature adjustment target device via a field network;
an arithmetic operation module connected to the communication module via the main control device, and connected to the temperature sensors attached to the respective predetermined positions of the second refrigerant circuit; and
a signal output module connected to the arithmetic operation module,
wherein the communication module is configured to store a target temperature information of each of the temperature adjustment target parts included in a communication frame periodically received via the field network in a predetermined position of the memory that is determined in advance for each of the temperature adjustment target parts,
the main control device is configured to transmit the target temperature information stored in the memory of the communication module to the arithmetic operation module,
the arithmetic operation module is configured to receive the target temperature information of each of the temperature adjustment target parts, receive a refrigerant temperature information indicating a current temperature of the second refrigerant from each of the temperature sensors corresponding to each of the temperature adjustment target parts, calculate control parameters for adjusting an opening degree of each corresponding control valve so that each temperature of the plurality of temperature adjustment target parts becomes a target temperature indicated by the received target temperature information based on the received refrigerant temperature information, and transmit each of the calculated control parameters to the signal output module, and the signal output module is configured to transmit a signal to each of the control valves for adjusting the opening degree of each of the control valves based on each of the received control parameters.

2. The temperature control device according to claim 1, wherein the arithmetic operation module calculates each of the control parameters for adjusting the opening degree of each of the corresponding control valves by executing a PID arithmetic operation to achieve the target temperature based on the received target temperature information and the received refrigerant temperature information.

3. The temperature control device according to claim 1, wherein the arithmetic operation module includes a memory, stores the received target temperature information and the received refrigerant temperature information in a predetermined position of the memory that is determined in advance for each of the temperature adjustment target parts, calculates each of the control parameters by using the stored target temperature information and the stored refrigerant temperature information, and stores each of the calculated control parameters in the predetermined position of the memory that is determined in advance for each of the temperature adjustment target parts.

4. A chiller apparatus for plasma treatment comprising the temperature control device according to claim 1.

5. The temperature control device according to claim 1, wherein the communication module regularly receives the communication frame at a predetermined time period that is set in advance via the field network.

6. The temperature control device according to claim 5, wherein the temperature adjustment target device is a master, and the communication module is a slave.

* * * * *